(12) United States Patent
Grötsch et al.

(10) Patent No.: US 8,809,082 B2
(45) Date of Patent: Aug. 19, 2014

(54) METHOD FOR PRODUCING LAMPS (75) Inventors: Stefan Grötsch, Bad Abbach (DE);
Klaus Müller, Pettendorf (DE)

(73) Assignee: OSRAM Opto Semiconductors GmbH,
Regensburg (DE)

( * ) Notice: Subject to any disclaimer, the term of this patent is extended or adjusted under 35 U.S.C. 154(b) by 247 days.

(21) Appl. No.: 13/142,391

(22) PCT Filed: Nov. 27, 2009

(86) PCT No.: PCT/DE2009/001693
§ 371 (c)(1),
(2), (4) Date: Sep. 20, 2011

(87) PCT Pub. No.: WO2010/075831
PCT Pub. Date: Jul. 8, 2010

(65) Prior Publication Data
US 2012/0107973 A1  May 3, 2012

(30) Foreign Application Priority Data
Dec. 30, 2008  (DE) .......................... 10 2008 063 325

(51) Int. Cl.
*H01L 33/48* (2010.01)
*H05K 1/02* (2006.01)
*H01L 33/64* (2010.01)
*H05K 3/00* (2006.01)
*H01L 33/00* (2010.01)
*H01L 25/075* (2006.01)
*H05K 1/18* (2006.01)
*H05K 3/34* (2006.01)

(52) U.S. Cl.
CPC .... *H01L 33/483* (2013.01); *H05K 2201/10106* (2013.01); *H05K 2201/2081* (2013.01); *H05K 1/021* (2013.01); *H01L 33/64* (2013.01); *H05K 3/0061* (2013.01); *H01L 33/005* (2013.01); *H01L 25/0753* (2013.01); *H05K 1/182* (2013.01); *H05K 2203/0315* (2013.01); *H01L 2224/48227* (2013.01); *H05K 3/341* (2013.01); *H01L 2224/73265* (2013.01)
USPC .............................. 438/27; 438/122; 438/612

(58) Field of Classification Search
CPC ........................... H01L 33/486; H01L 33/641
USPC ................... 438/27, 122, 612; 257/720, 779, 257/E33.057
See application file for complete search history.

(56) References Cited

U.S. PATENT DOCUMENTS

| | | | |
|---|---|---|---|
| 6,546,620 B1 | 4/2003 | Juskey et al. | |
| 6,660,559 B1 | 12/2003 | Huemoeller et al. | |
| 8,189,123 B2 * | 5/2012 | Kuhn et al. | 348/744 |
| 2006/0289887 A1 | 12/2006 | Bui et al. | |

(Continued)

FOREIGN PATENT DOCUMENTS

| | | |
|---|---|---|
| CN | 101154656 | 4/2008 |
| CN | 101176340 | 5/2008 |

(Continued)

*Primary Examiner* — Zandra Smith
*Assistant Examiner* — Toniae Thomas
(74) *Attorney, Agent, or Firm* — Cozen O'Connor (57) ABSTRACT

A method for producing luminous means proposes providing a carrier serving as a heat sink, said carrier comprising a planar chip mounting region. The planar chip mounting region is structured for the purpose of producing a first partial region and at least one second partial region. In this case, the first partial region has a solder-repellent property after structuring. Afterward, a solder is applied to the planar chip mounting region, such that said solder wets the at least one second partial region. At least one optoelectronic body is fixed into the at least one second partial region with the solder at the carrier. Finally, contact-connections are formed for the purpose of feeding electrical energy to the optoelectronic luminous body.

17 Claims, 5 Drawing Sheets

A

(56) References Cited

U.S. PATENT DOCUMENTS

| | | | |
|---|---|---|---|
| 2008/0019103 A1 | 1/2008 | Kim | |
| 2008/0192153 A1 | 8/2008 | Kuhn et al. | |
| 2008/0206928 A1 | 8/2008 | Onishi et al. | |
| 2010/0079964 A1* | 4/2010 | Sewald et al. | 361/760 |
| 2010/0089625 A1* | 4/2010 | Kluge | 174/257 |

FOREIGN PATENT DOCUMENTS

| | | | |
|---|---|---|---|
| CN | 101254561 | | 9/2008 |
| DE | 25 28 000 | * | 1/1977 |
| DE | 10 2004 016 697 | | 9/2005 |
| DE | 10 2005 031 336 | * | 11/2006 |
| DE | 10 2008 001 221 | * | 10/2008 |
| EP | 1 575 084 | * | 9/2005 |
| JP | 2008-028377 | | 2/2008 |
| JP | 2008-545997 | | 12/2008 |
| JP | 2010-504630 | | 2/2010 |
| WO | WO 2005/043966 | | 5/2005 |
| WO | WO 2006/119723 | | 11/2006 |
| WO | WO 2008/040307 | * | 4/2008 |

* cited by examiner

METHOD FOR PRODUCING LAMPS

RELATED APPLICATIONS

This is a U.S. national stage of application No. PCT/DE2009/001693, filed on Nov. 27, 2009.

This patent application claims the priority of German application no. 10 2008 063 325.9 filed Dec. 30, 2008, the disclosure content of which is hereby incorporated by reference.

FIELD OF THE INVENTION

The invention relates to a method for producing luminous means, and in particular a method for producing assemblies comprising optoelectronic components.

BACKGROUND OF THE INVENTION

Applications with optoelectronic components are increasingly gaining in importance. These include not only simple luminous means such as lamps but also backlighting systems, for example for LCD screens or monitors. In this case, the term optoelectronic component denotes an element which emits light in an operation mode when supplied with electrical energy. This includes not only semiconductor-based light-emitting diodes but also organic light-emitting diodes, combinations of organic and inorganic compounds suitable for light emission and other light-emitting components.

In some applications, very high light powers are required, for example for projectors. This primarily involves the use of luminous bodies which emit light in different colors, such that a white mixed color arises.

In order to achieve the highest possible luminances, it is often the case that different optoelectronic components are positioned on a common chip and subsequently driven and supplied with energy by means of corresponding leads. The subdivision into different individual chips has the advantage that, firstly, luminosity and color can be regulated better and, secondly, the probability of failure is reduced and/or the repair possibilities are improved. By contrast, on account of inaccurate positioning, a non-uniform light distribution and luminance can arise, which can become apparent in a disturbing manner.

One object of the invention is to provide a method in which a higher and more uniform luminance can be achieved when producing a luminous means of the type described above.

According to an embodiment of the invention, the luminance and the uniformity, also designated as etendue for simplification, can be improved by means of a suitable structuring of a planar chip mounting region on which the individual luminous bodies are applied.

One configuration involves providing a carrier serving as a heat sink, said carrier comprising a planar chip mounting region. The carrier can have a metal core, a metal substrate having such a planar chip mounting region. A ceramic substrate having a metalized chip mounting region, a PCB (Printed Circuit Board) having a planar, if appropriate metalized, chip mounting region or else a leadframe having such a region can likewise be provided as the carrier. Depending on the respective carrier, the subsequent chip mounting region is pretreated, for example metalized. Any substrate with SMT capability that can be metalized in partial regions in order to form a planar chip mounting region is suitable as the carrier.

The planar chip mounting region is structured for the purpose of producing a first partial region and at least one second partial region. The structuring is effected in such a way that the first partial region has a solder-repellent property after structuring. Alternatively, the first partial region becomes solder-repellent as a result of the structuring of the chip mounting region, such that the chip mounting region is solder-repellent in the first partial region and solder-attracting in the second partial region.

The terms "solder-repellent" or "solder-repellent property" are understood to mean a property of the first partial region which has the effect that, upon subsequent application of a solder or solder flux, the latter does not wet or scarcely wets the first partial region. Consequently, after the application of a solder on the planar chip mounting region, the solder is concentrated primarily in the second partial region and wets the latter.

Afterward, at least one optoelectronic body, preferably an optoelectronic semiconductor component, is applied to the solder in the at least one second partial region and fixedly connected to the carrier. As a result of the structuring and the production of the solder-repellent first partial region, the optoelectronic body applied on the solder is thus fixed in the second partial region. During production in the liquid state of the solder, the optoelectronic body floating on the solder "follows" the solder into the second partial region since the solder wets the chip mounting region only in this partial region.

The structuring of the planar chip mounting region into partial regions having a solder-repellent and solder-attracting or wetting property thus makes it possible to form partial regions in which one or more optoelectronic bodies are fixed and connected to the chip mounting region by means of a previously applied solder.

Afterward, an electrical contact-connection, suitable for feeding electrical energy to the optoelectronic luminous body, can be formed.

In one configuration, it is expedient in this regard for the carrier serving as a heat sink already to be formed as an electrode or for the planar chip mounting region to be formed as an electrode. In this case, the planar chip mounting region serves not only as part of the heat sink, but also as electrical contact to the optoelectronic component.

In one configuration, the planar chip mounting region comprises, in the second partial region, at least one metallic partial layer which is at least partly wettable by the solder. The partial layer can comprise, for example, gold, silver or some other non-oxidizing material. In one embodiment, the planar mounting region comprises different partial layers composed of different metals that are arranged one above another. Said metals can comprise, for example, nickel, copper, aluminum, silver, gold, titanium or tungsten. In this case, a gold layer can be applied above a nickel layer in order to prevent a diffusion of gold into underlying partial layers, for example composed of copper.

One configurational form of the method proposes, for the purpose of structuring the chip mounting region and producing the first partial region, removing parts of the gold layer within the chip mounting region and oxidizing the underlying nickel layer. The oxidation of the underlying layer, in particular of a nickel layer, produces a first partial region having a solder-repellent property, such that the solder applied thereto does not wet this partial region, or wets it only very slightly.

In one configuration, such a structuring is achieved by providing an optical light source, preferably a laser. Afterward, for the purpose of producing the structuring of the planar chip mounting region, the first partial region of the planar chip mounting region is irradiated by means of the optical light source and at least one of the metallic partial layers is thus oxidized. In one exemplary embodiment, as a result of the irradiation, a surface material of the first partial region is melted or evaporated and an underlying material uncovered is oxidized. This underlying oxidized material has the solder-repellent properties. By way of example, the surface material can be gold, aluminum or silver which is evaporated by the irradiation preferably by means of a laser. An underlying material forming a further partial layer is uncovered. Said material can comprise nickel, for example. The uncovered material is then oxidized, for example with the aid of the optical radiation source, but also by means of other physical or chemical methods.

In the case of an uncovered nickel layer, the latter is oxidized by the laser beam and the nickel thus oxidized is solder-repellent.

Generally, for the purpose of producing a material having a solder-repellent property, a surface material of the planar chip mounting region can be chemically altered by physical or chemical methods and form a compound.

In another configuration, the planar chip mounting region is structured by a soldering resist layer being applied on the planar chip mounting region. Said solder resist layer is likewise solder-repellent. Afterward, the soldering resist layer is structured for the purpose of producing the first and second partial regions and is then removed in the second partial region, such that the underlying surface of the second partial region of the chip mounting region is uncovered again. The soldering resist layer can be structured for example by means of suitable mask methods and exposure. The rest of the soldering resist layer remains on the chip mounting region to form the first partial region.

In a further configuration, a soldering resist layer is directly selectively applied to the planar chip mounting region and the first partial region is thus defined. In this case, too, the soldering resist layer is solder-repellent. Such application can be effected by means of a stencil method or a solder dispensing method, for example. If necessary, by uncovering and/or processing sections of the second partial region, these can subsequently be cleaned of an undesirably applied soldering resist layer, such that the second partial region again comprises the surface that is wettable by solder.

A solder dispensing method is appropriate for applying a solder to the planar chip mounting region within the second partial region. This is advantageous particularly if the chip mounting region is situated more deeply within the carrier than the region which surrounds it and which can contain, for example, the lead or other electrical contacts.

In another configuration, a carrier serving as a heat sink and having a planar chip mounting region is provided and a contact-connection layer is applied thereon. The carrier can be a PCB, a ceramic substrate, a metal core, a plastic or else a combination of these carrier materials.

Outside the chip mounting region, a dielectric layer is applied to the carrier in a planar fashion in order to avoid a short circuit with the chip mounting region. Conductor tracks and contact pads and also other necessary elements are then vapor-deposited, deposited or applied in some other way on the dielectric layer. The chip mounting region is furthermore correspondingly structured for the purpose of producing the first and/or second partial region and a solder material is subsequently deposited onto the at least one second partial region, for example by means of a solder dispensing method. As a result of the structuring of the planar chip mounting region, the solder is forced into the at least one second partial region and wets the latter. Afterward, different optoelectronic components can be placed on the solder in the at least one second partial region and be intimately connected to the chip mounting region by means of the solder being heated. In a last step, an electrical contact-connection for feeding electrical energy is performed.

The electrical contact-connection can be effected by means of wire bonding, for example, in which bonding wires are connected firstly to the optoelectronic luminous bodies and secondly to contact pads outside the chip mounting region.

In a further configuration of the invention, the chip mounting region is subdivided into different second partial regions, of which in each case two adjacent second partial regions are separated by a section of the first partial region. In this way, a plurality of optoelectronic luminous bodies can be fixed on the chip mounting region in regions that are easily separated spatially but are very closely spaced apart. By way of example, it is possible to arrange optoelectronic luminous bodies, embodied for emitting light having different wavelengths, on the chip mounting region in such a way that a desired overall luminous pattern arises. In particular mixed colors, for example the color white, can be realized by arranging different luminous bodies on the chip mounting region. In this case, by means of a suitably thin structuring of the first partial region between two partial regions it is possible to achieve a substantially uninterrupted joining-together of the different optoelectronic luminous bodies.

BRIEF DESCRIPTION OF THE DRAWINGS

The invention is explained more thoroughly in detail below on the basis of a plurality of exemplary embodiments with reference to the drawings, in which.

DETAILED DESCRIPTION OF THE DRAWINGS

In the following exemplary embodiments and figures, identical or identically acting constituent parts can be provided with identical reference symbols. The figures and the size relationships, in particular also the size relationships of individual partial regions and layers with respect to one another, should not be regarded as true to scale, in principle. Rather, they serve for clarifying individual aspects of the invention. They may be illustrated with an exaggerated size or thickness in order to afford a better understanding or in order to enable better illustration.

Figure 1:
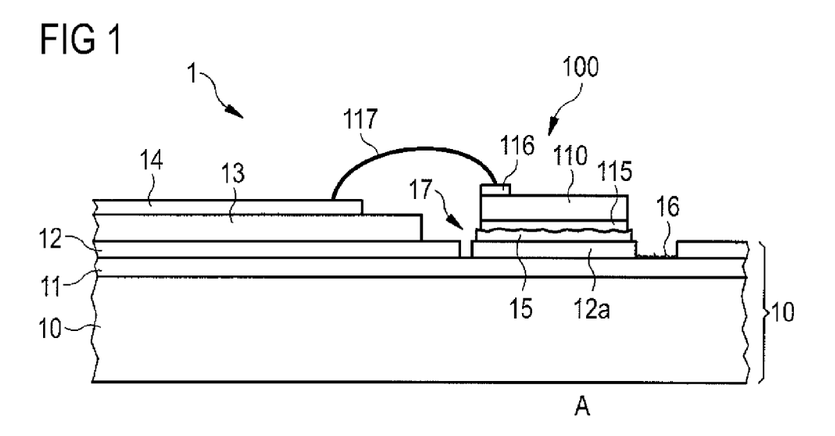
FIG. 1 shows a cross-sectional illustration of a luminous means, produced according to an embodiment of the invention.

FIG. 1 shows, in a cross-sectional illustration, an excerpt from a luminous means such as was produced according to a method in accordance with the principle proposed. For this purpose, the luminous means 1 is applied on a carrier 10a serving as a heat sink. Said carrier comprises a continuous copper core 10, which has a sufficient stability and the heat capacity of which is sufficiently high in order to dissipate the heat produced by the luminous body 100 during operation. The copper core 10 furthermore has the advantage that it can serve as a rear-side electrode for the luminous body 100.

Alternatively, it is also possible to use a ceramic substrate as a carrier with a metalized chip mounting region.

Additional partial layers 11 and 12 are applied on the copper core 10 for the purpose of better fixing of optoelectronic components 100. Said partial layers enable good wetting of a subsequently applied solder on which the luminous body 100 is fixed. In the present exemplary embodiment, the individual partial layers comprise a partial layer composed of nickel 11 and a gold layer 12 applied thinly thereon. The gold layer 12 prevents an undesired oxidation of the layers situated underneath and thus lengthens the lifetime.

On the gold layer 12, which is in electrically conductive contact with the copper core 10 via the nickel partial layer 11, a dielectric layer 13 is applied in partial regions. Contact lugs 14 are vapor-deposited on said dielectric layer, said contact lugs subsequently enabling the contact-connection to the luminous body 100 by means of bonding wires 117.

In the chip mounting region A, the partial layers 11 and 12 are structured in individual partial regions 17 in order to ensure that the luminous body 100 is fixed on a solder 15. Said solder 15 is applied in a second partial region 12a, which is surrounded by the structured partial regions 17. As can be discerned, the solder does not wet the structured partial regions 17, but rather only the second partial region 12a of the chip mounting region. The optoelectronic component applied and fixed on the solder is thus fixed in the second partial region 12a. The luminous body 100, for example in the form of a light-emitting diode, comprises a mirror layer 115 arranged on the rear side for the purpose of improving the coupling-out of light.

Furthermore, it contains one or more partial layers 42, wherein at least one of the partial layers has a layer suitable for light emission. In one embodiment, the luminous body can be designed as a thin-film light-emitting diode. Corresponding ways of producing such luminous bodies are known to the person skilled in the art, and so a renewed explanation will be dispensed with.

In this exemplary embodiment, the luminous body 100 has on its surface a contact 116, which is fixed by means of a bonding wire 117 to a corresponding contact pad and a contact lug 14 on the surface of the luminous means and the dielectric layer 13.

The structured first partial regions 17 are covered with a thin nickel oxide layer 16. Said nickel oxide layer, which is produced by the removal of the gold layer and subsequent oxidation, is solder-repellent, such that when solder material is applied to the chip mounting region, said partial regions are not wetted. Different adhesion forces subsequently draw a luminous body applied on the solder into the partial regions with the most solder. As a result, the position of a luminous body within the chip mounting region can be precisely defined by structuring of the chip mounting region into partial regions 17 and 12a.

In order to produce a luminous means of this type, in this exemplary embodiment, the gold layer 12a is removed by a laser. For this purpose, a laser beam is directed at and guided along the chip mounting region, such that the partial layer 12 evaporates at the locations swept over by the laser beam and thus defines the partial regions 17. The energy additionally introduced by the laser beam simultaneously oxidizes with oxygen the underlying nickel layer 11, which then has the solder-repellent properties. When subsequently applying the solder, care should be taken to ensure that a flux used does not reduce anew the nickel oxide layer 16 in the structured partial regions 17, thereby canceling the structuring again.

After the structuring, the solder is applied, for example by means of a solder dispensing method. The luminous bodies 100 applied are fixed by the solder on the second partial regions 12a and are fixed thereto. Afterward, by means of a wire bonding method, the electrical contact-connection can be effected using contact wires 117 to the luminous body or the optoelectronic component 100.

Figure 2:
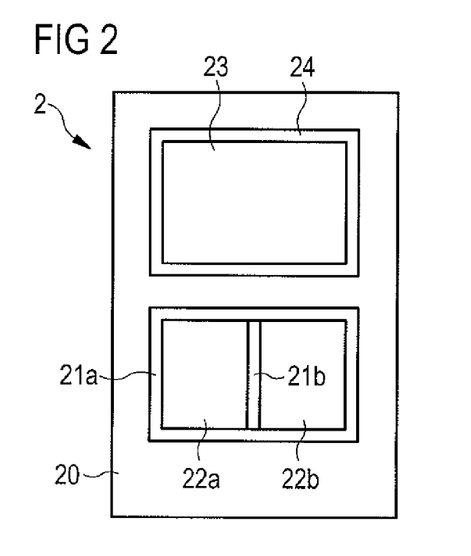
FIG. 2 shows a plan view over a planar chip mounting region of a luminous means according to an embodiment of the invention.

FIG. 2 shows a plan view for elucidating the different structuring possibilities. The illustration shows a plan view of a chip mounting region which can form part of a larger carrier. The chip mounting region comprises two main regions, which, in each case considered by themselves, are in turn structured into first and second partial regions. In a first main region, the chip mounting region is structured by a circumferential partial region 24, such that an area 23 uncovered therein is present. The latter forms the second partial region. Solder material can be applied on the area by means of a dispensing method, a deposition method or a printing method. By contrast, the circumferential partial region 24 has solder-repellent properties, such that the solder material is substantially concentrated in the region 23.

A second main region of the structured chip mounting region is subdivided into two second partial regions 22a and 22b, which are in each case separated from one another by a structured web 21b. Here, too, the partial regions 22a and 22b are completely surrounded by a solder-repellent first partial region 21a. Solder material deposited in the two second partial regions 22a and 22b remains separated by the structured web 21b, such that, in this embodiment, by way of example, two separate optoelectronic components can be positioned on the individual partial regions 22a and 22b.

The surfaces of the partial regions 23 and also 22a and 22b are metallic, such that the applied solder material firstly serves for heat dissipation in an operation mode of the optoelectronic component and secondly, at the same time, can form a rear electrical contact.

The proposed structuring of the chip mounting region makes it possible to provide partial regions which are arranged differently geometrically and in which optoelectronic components can be positioned in a positionally precise manner. As a result, it is possible overall to improve the entendue and the uniformity of the light emission.

Figure 3:
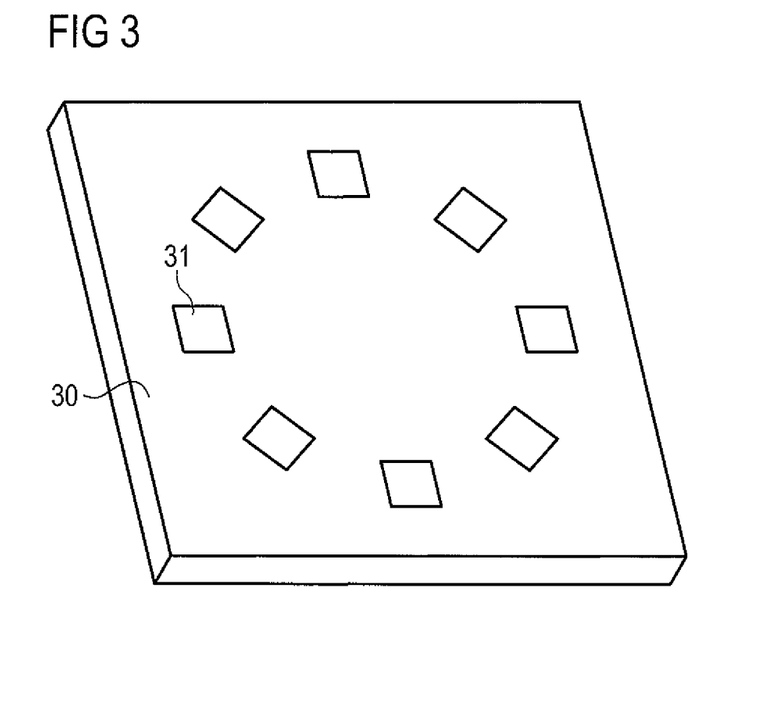
FIG. 3 shows a plan view of a chip mounting region in an alternative embodiment.

FIG. 3 shows in this regard an excerpt from a more complex chip mounting region, in which rectangular partial regions 31 are structured. The latter are arranged substantially in circular fashion around a common midpoint. By means of a suitable circuitry on the carrier, it is possible for the optoelectronic components to be driven individually and thus for different lighting applications to be realized.

Different sizes and forms of the partial regions make it possible to provide different optoelectronic components and, at the same time, to take account of the different emission characteristics thereof. By way of example, mixed colors can also be generated in this way by components suitable for light emission with different wavelengths being arranged adjacent to one another. Since the first partial region of the chip mounting region, which has the solder-repellent properties after structuring, can comprise very small line thicknesses, components can also be positioned sufficiently close together without a reduction of the light power or the emission quality occurring during operation. In this case, it is even possible, through a suitable choice of the thickness of the solder-repellent first partial region, which separates two adjacent second partial regions, to arrange and fix optoelectronic components directly alongside one another with a distance that is less than the thickness of the first partial region.

At the same time it becomes possible for different optoelectronic components to be driven individually in order thus also to realize different applications. The structuring of the chip mounting region permits the use of smaller optoelectronic components, which, precisely in production, are more tolerant of faults and less prone to failure than correspondingly large-area components.

FIGS. 4A to 4E show an exemplary embodiment of a method for producing assemblies comprising optoelectronic components.

Figure 4A:
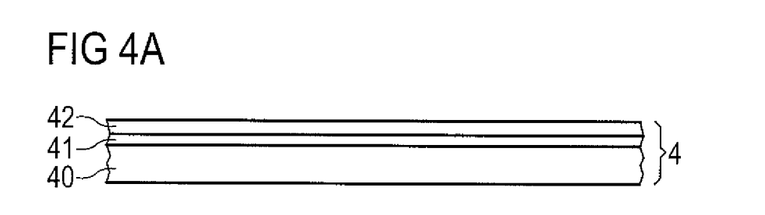
FIGS. 4A to 4E show cross-sectional illustrations and plan views for elucidating an exemplary embodiment of the method.

A first step in accordance with FIG. 4A involves providing a carrier 4 serving as a heat sink. Said carrier here comprises a copper core 40, which primarily serves as a heat sink, but can also comprise other materials. An insulating dielectric layer 41 is applied on the copper core 40, said dielectric layer being intended to prevent a short circuit between the copper core 40 and an electrically conductive layer 42 situated above the latter. The dielectric layer 41 likewise has a sufficient thermal conductivity here.

The layer 42 comprises a plurality of metallization layers, which are not illustrated in greater detail here for reasons of clarity. By way of example, firstly a metallization composed of copper is applied on the dielectric layer 41. After, nickel is vapor-deposited onto said metallization and a thin gold layer is applied on said nickel in turn in order to prevent oxidation. The nickel layer arranged between copper and gold is necessary in order to avoid diffusion of the gold into the copper layer and subsequent oxidation of the copper layer. Instead of the copper-nickel-gold coating proposed here, it is also possible to use other materials. By way of example, partial layers composed of copper and silver and/or nickel and silver are also suitable for fixing subsequently applied luminous bodies.

The dielectric layer 41 is a few micrometers thick, and the copper metallization layer situated above it can have a thickness of 35 µm to 70 µm or more, the nickel layer amounting to approximately 10 µm to 20 µm.

Figure 4B:
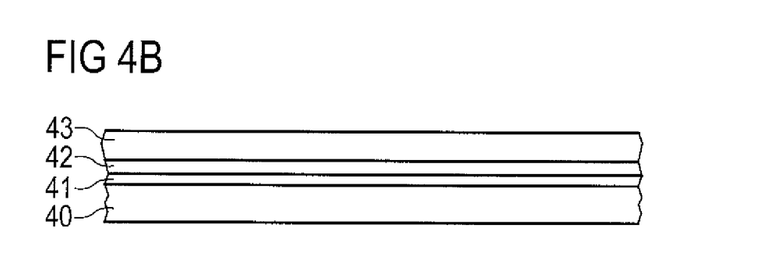
Figure 4C:
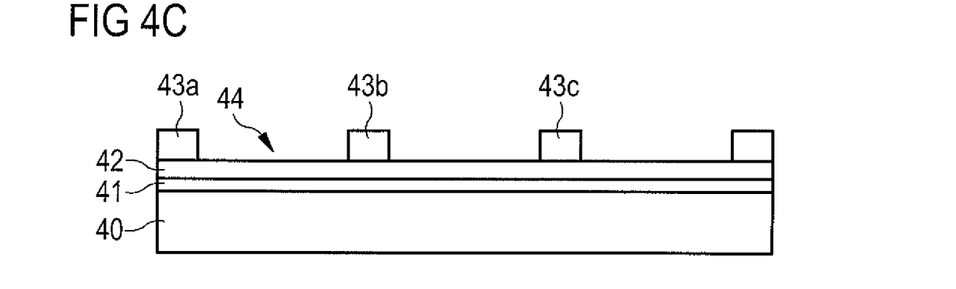

For the purpose of structuring the chip mounting region and a subdivision into first and second partial regions, wherein the first partial region is intended to have a solder-repellent effect, a soldering resist layer is then deposited over a large area on the partial layer 42. The result is illustrated in FIG. 4B. Afterward, by means of photomask methods, the soldering resist layer is structured and subdivided into individual first partial regions 43a, 43b and 43c. By way of example, a particularly insensitive photoresist or some other organic layer is also suitable as the soldering resist layer. It should be resistant at least until the production of the component is concluded.

Between the individual partial regions 43a, 43b and 43c, the then unexposed part of the photoresist layer acting as a soldering resist layer is removed and second partial regions 44 are thus defined. After the removal of the unexposed regions, the surface of the metallization layer 42 is uncovered again.

Figure 4D:
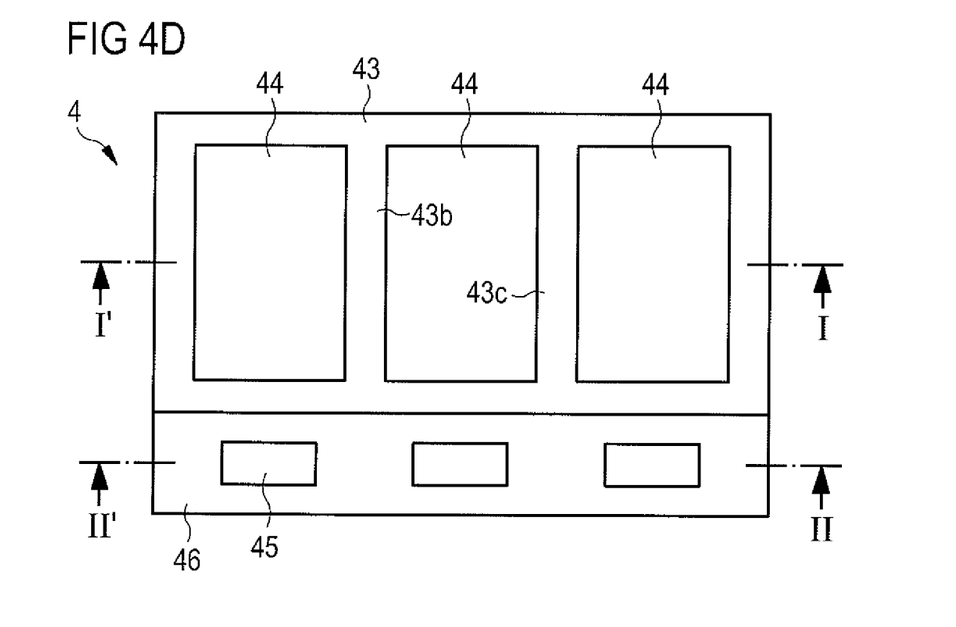

FIG. 4D shows an excerpt from a carrier in plan view for illustrating the individual structured first and second partial regions 43a, 43b, 43c and 44. The section along the axis I'-I corresponds to the cross-sectional illustration in accordance with FIG. 4C. In the second partial regions 44, the metallic surface is uncovered.

Figure 4E:
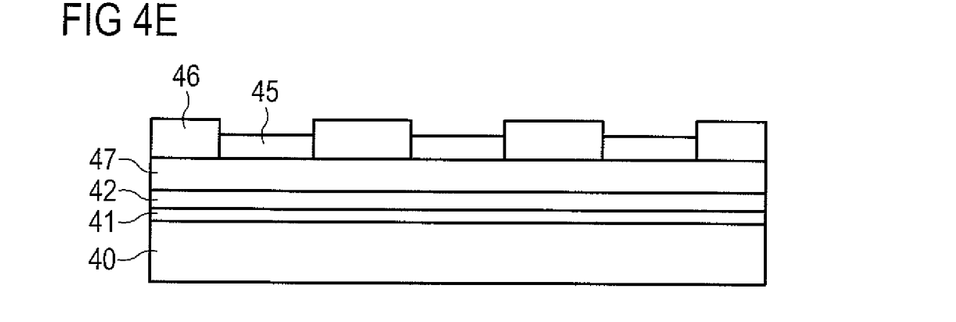

In a lower region of the plan view, contact pads 45 are additionally uncovered, said contact pads being surrounded by a dielectric protective layer 46. The cross-sectional illustration along the line II'-II is illustrated in FIG. 4E. A further dielectric layer 47 is applied on the metallization layer 42 for the purpose of electrical insulation. Alternatively, said layer 47 can also be formed by the soldering resist layer provided that the latter has an electrically insulating effect. The contact elements 45 are deposited as contact lugs and contact pads on the dielectric layer 47. In order to prevent oxidation of the contact pads and reduction of a short-circuit probability, these are surrounded by a further dielectric protective layer 46. In the exemplary embodiment illustrated, the contact lugs for feeding electrical energy to the contact pads 45 are covered by the protective layer 46.

Consequently, only the contact pads 45 are uncovered, which, for example, are connected to the optoelectronic components in the partial regions 44 via a bonding wire connection. In a section of the carrier 4 that is not illustrated here, contact holes are provided in the dielectric layer 47, said contact holes enabling an electrical contact to the metallic layer 42 and thus the optoelectronic components in the partial regions 44.

FIGS. 5A to 5D show a further exemplary embodiment of a method for producing luminous means. In this method, a carrier 50 serving as a heat sink, for example a copper core, a ceramic core, a PCB, a leadframe or a similar carrier having a high thermal conductivity, is covered with metallically electrically conductive layers in a chip mounting region 51 and also in a wire bonding region 52. In this case, the wire bonding region 52 and the chip mounting region 51 are in an electrically conductive contact. The further cutouts present on the carrier serving as a heat sink constitute fixing elements, by means of which the component subsequently produced can be fixed to further elements.

Figure 5A:
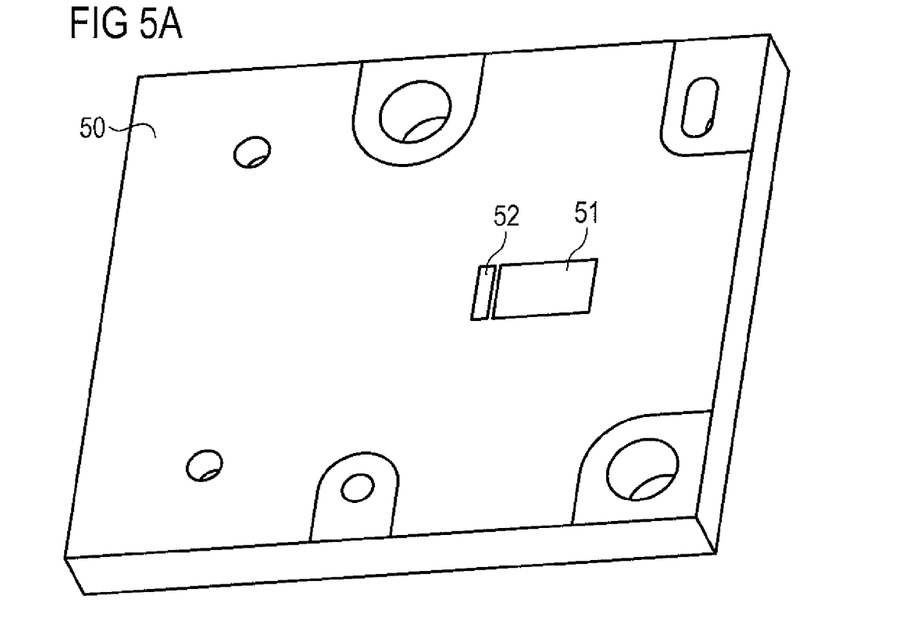
FIGS. 5A to 5D show a further exemplary embodiment of the method for producing luminous means in plan view.
Figure 5B:
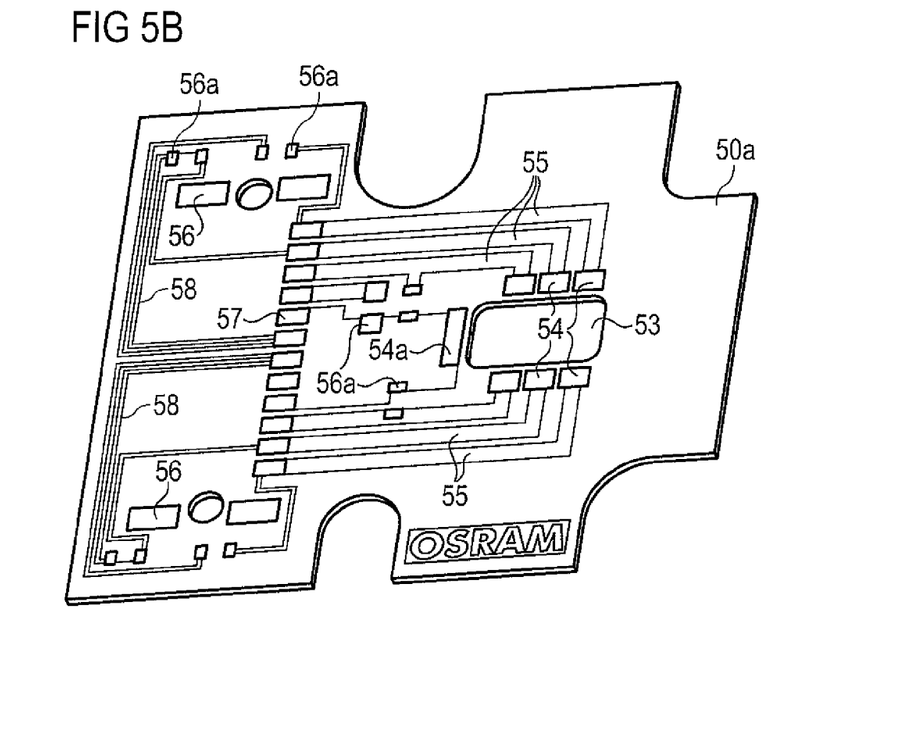

FIG. 5B shows a thin circuit board for modular construction with the corresponding cutouts using laminate technology. The thin circuit board 50a comprises a plastic into which different contact lines 55 and 58 are respectively incorporated in one or a plurality of layers. Contact elements 54, 54a, 56, 56a and 57 are arranged on the surface of the thin circuit board. Said contact elements are uncovered, while the contact lines 55 can be coated with a thin protective layer for protection against damage. The contact elements comprise, for example, a copper layer or a thin copper-nickel-gold metallization layer. Some of the contact lugs 57 are connected to the contact lugs 54 via leads 55. Moreover, a central cutout 53 is provided, which enables subsequent access to the structured chip mounting region 51 and the structured wire bonding region 52 in accordance with FIG. 5A. The further contact elements 56a, 56 and 57 can be populated with different components using SMD technology.

Figure 5C:
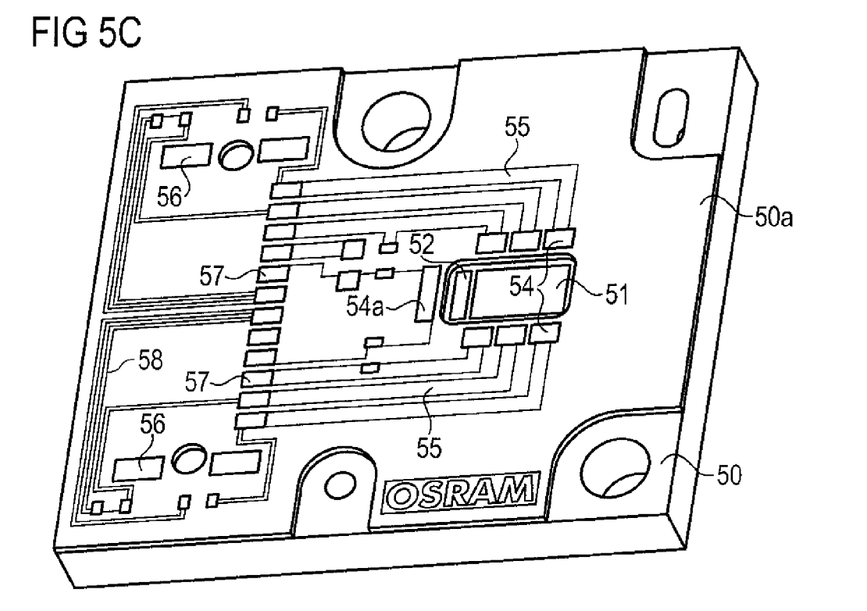

In a next step, the thin circuit board is fixed, for example laminated, on the carrier 50 serving as a heat sink. For this purpose, it can be expedient, prior to lamination, to apply a thin resist layer on the carrier 50 whilst omitting the chip mounting region 51 and the wire bonding region 52. An intimate connection of the thin circuit board to the carrier is realized by the lamination of the circuit board on the carrier. At the same time, the carrier still acts as a heat sink.

The contact elements 54 are then arranged adjacent to the cutout and the structured chip mounting region 51. A further contact-connection 54a is situated adjacent to the structured wire bonding region 52 of the carrier 50.

Figure 5D:
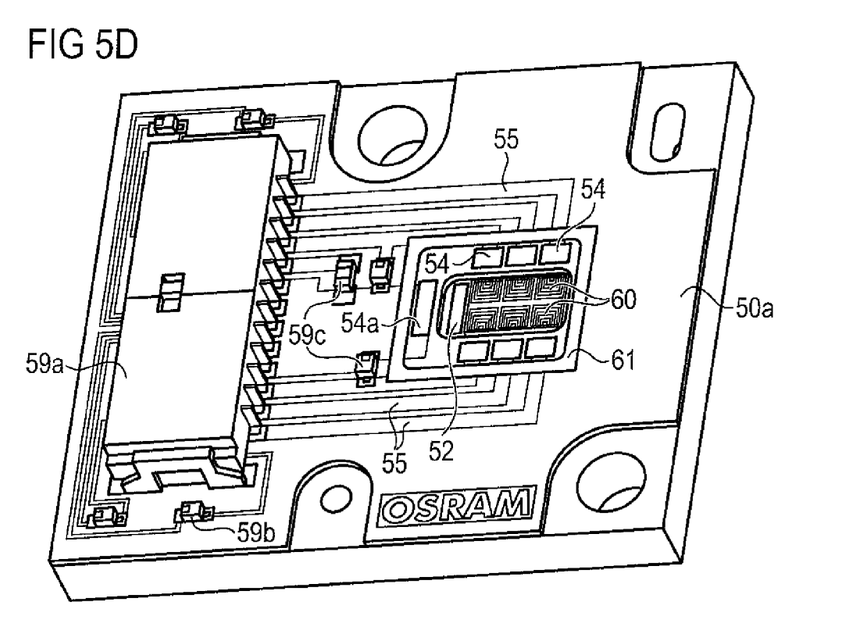

In a further step, illustrated in FIG. 5D, solder paste is then applied to the structured chip mounting region 51 by means of a solder dispensing method. The solder is prevented from flowing by the structuring of the chip mounting region and the subdivision into first and second partial regions, wherein the first partial regions of the chip mounting region have solder-repellent properties. As a result, the applied solder material only wets the second partial regions. The semiconductor components 60 are subsequently arranged on the chip mounting region. By means of adhesion forces, the solder paste forces the individual optoelectronic components into the respective second partial regions, thus resulting in the regular arrangement illustrated in FIG. 5D.

In this exemplary embodiment, the thin-film board was laminated before the application of the solder and the optoelectronic components. This is not mandatory, however. It is likewise possible firstly to apply solder material to the chip mounting region, and thus to fix the optoelectronic components, by means of different methods, e.g. solder dispensing methods or printing methods. Afterward, the thin circuit board is then fixed to the carrier.

In the exemplary embodiment in FIGS. 5A to 5D, six individual optoelectronic components are fixed in "2*3" form in the chip mounting region. The chip mounting region is correspondingly subdivided into six rectangular second partial regions. The individual contact pads 54 are connected via bonding wires to the contact pads on the optoelectronic components 60. The structured wire bonding region 52 is connected via contact wires to the contact pad 54a on the laminate carrier.

Afterward, by means of a solder dispensing method, solder material can be deposited on the further contact pads and SMD components 59c, 59b and chip components 59a are respectively fixed later. An applied protective ring 61 surrounds the contact pads 54, 54a and the omitted region with the chip mounting region and the wire bonding regions 51 and 52, respectively. The protective ring 61 also makes it possible for the solder for the contact pads 56, 57 and 56a also to be applied differently, for example by screen printing or stencil printing, instead of by solder dispensing methods. As a result of the structuring of a chip mounting region for subdivision into first and second partial regions, optoelectronic components and generally luminous bodies can be fixed at positions well defined beforehand by means of a solder material. This improves a positioning of individual components within a large-area chip mounting region.

For this purpose, the first partial region is solder-repellent after structuring, that is to say that an applied solder material does not wet said partial region. Correspondingly, when optoelectronic components are arranged on the solder material, they are drawn by the solder material into the second partial region and fixed there. A structuring can be effected, for example, by corresponding application of soldering resist layers. Alternatively it is also possible to remove or oxidize metal layers which are already situated on the carrier serving as a heat sink in the chip mounting region, such that they have solder-repellent properties. Precisely this last enables particularly fine and narrow structures using laser structuring methods.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A method for producing a luminous element, comprising:
    providing a carrier serving as a heat sink, said carrier comprising a planar chip mounting region;
    structuring the planar chip mounting region to produce a first partial region and at least one second partial region, wherein the first partial region is solder-repellent after structuring;
    applying a solder to the planar chip mounting region, such that said solder wets the at least one second partial region;
    applying at least one optoelectronic component to the solder in the at least one second partial region;
    forming an electrical contact-connection configured to feed electrical energy to the optoelectronic component;
    forming a thin circuit board having a cutout, at least one metallic conduction track and at least one contact region; and
    applying the thin circuit board to the carrier in such a way that the cutout is located above the chip mounting region,
    wherein the at least one optoelectronic component is applied before or after the thin circuit board is applied.

2. The method according to claim 1, wherein the planar chip mounting region comprises in the second partial region, at least one metallic partial layer which is at least partly wettable by the solder.

3. The method according to claim 1, wherein structuring the planar chip mounting region comprises:
    applying a soldering resist layer on the planar chip mounting region wherein the soldering resist layer is solder-repellent;
    structuring the soldering resist layer for the purpose of producing the first and the second partial region; and
    removing the soldering resist layer in the second partial region.

4. The method according to claim 1, wherein structuring the planar chip mounting region comprises:
    applying a soldering resist layer on the first partial region of the planar chip mounting region, wherein the soldering resist layer is solder-repellent.

5. The method according to claim 4, wherein structuring the planar chip mounting region comprises uncovering and/or processing sections of the second partial region, such that the latter has a surface that is wettable by solder.

6. The method according to claim 1, wherein structuring the planar chip mounting region comprises:
    providing an optical light source; and
    structuring the planar chip mounting region for the purpose of producing the second partial region by irradiating the first partial region of the planar chip mounting region.

7. The method according to claim 6,
    wherein, as a result of the first partial region being irradiated, a surface material of the first partial region is melted or evaporated and an underlying material uncovered in this way is oxidized,
    wherein the oxidized material has the solder-repellent properties.

8. The method according to claim 6, wherein the optical light source is a laser.

9. The method according to claim 1, wherein providing a carrier serving as a heat sink comprises providing a carrier having a chip mounting region, which comprises a layer sequence composed of at least two partial layers, at least one of which comprises at least one of the following materials: nickel, copper, aluminum, silver, gold, titanium, and tungsten.

10. The method according to claim 1, wherein the first partial region runs at least along the edges of the chip mounting region.

11. The method according to claim 1, further comprising:
    applying a dielectric layer on the carrier outside the chip mounting region;
    forming metallic contact tracks on the dielectric layer; and
    applying at least one component on the carrier and making the electrical contact with the contact tracks.

12. The method according to claim 1, wherein at least two adjacent second partial regions are separated by a first partial region.

13. The method according to claim 1, wherein forming an electrical contact-connection comprises:
bonding a contact wire onto a contact pad situated outside the chip mounting region; and
bonding the contact wire onto a contact pad on the optoelectronic component, wherein the contact pad makes electrical contact with a partial layer of a layer sequence suitable for light emission.

14. The method according to claim 1, wherein the optoelectronic component comprises a reflective layer at its side facing the solder.

15. The method according to claim 1, wherein the optoelectronic component comprises a contact pad at its side remote from the solder.

16. A method for producing a luminous element, comprising:
providing a carrier serving as a heat sink, said carrier comprising a planar chip mounting region;
structuring the planar chip mounting region by applying a soldering resist layer on the first partial region of the planar chip mounting region to produce a first partial region and at least one second partial region, wherein the soldering resist layer is solder-repellent and the first partial region is solder-repellent after structuring;
applying a solder to the planar chip mounting region, such that said solder wets the at least one second partial region;
applying at least one optoelectronic component to the solder in the at least one second partial region; and
forming an electrical contact-connection configured to feed electrical energy to the optoelectronic component.

17. A method for producing a luminous element, comprising:
providing a carrier serving as a heat sink, said carrier comprising a planar chip mounting region;
structuring the planar chip mounting region to produce a first partial region and at least one second partial region by providing an optical light source and structuring the planar chip mounting region for the purpose of producing the second partial region by irradiating the first partial region of the planar chip mounting region, wherein the first partial region is solder-repellent after structuring;
applying a solder to the planar chip mounting region, such that said solder wets the at least one second partial region;
applying at least one optoelectronic component to the solder in the at least one second partial region; and
forming an electrical contact-connection configured to feed electrical energy to the optoelectronic component.

* * * * *